US009152673B2

(12) United States Patent
Ruehle et al.

(10) Patent No.: US 9,152,673 B2
(45) Date of Patent: Oct. 6, 2015

(54) NON-DETERMINISTIC FINITE AUTOMATON (NFA) OVERFLOW RECOVERY THAT EJECTS AN END OF SCAN SET OF ACTIVE STATES INTO A BUFFER

(71) Applicant: Intel Corporation, Santa Clara, CA (US)

(72) Inventors: Michael Ruehle, Albuquerque, NM (US); Rahul Indarbhan Khinvasara, Pune (IN)

(73) Assignee: Intel Corporation, Santa Clara, CA (US)

( * ) Notice: Subject to any disclaimer, the term of this patent is extended or adjusted under 35 U.S.C. 154(b) by 404 days.

(21) Appl. No.: 13/710,582

(22) Filed: Dec. 11, 2012

(65) Prior Publication Data

US 2014/0164309 A1    Jun. 12, 2014

(51) Int. Cl.
*G06F 17/00*      (2006.01)
*G06F 17/30*      (2006.01)
*G11C 15/00*      (2006.01)

(52) U.S. Cl.
CPC .......... *G06F 17/30516* (2013.01); *G11C 15/00* (2013.01)

(58) Field of Classification Search
CPC ...................................... G11C 15/00
USPC ........................................ 706/12, 45, 47, 62
See application file for complete search history.

(56) References Cited

U.S. PATENT DOCUMENTS

| 6,697,276 B1 * | 2/2004 | Pereira et al. ............... 365/49.17 |
| 6,700,809 B1 * | 3/2004 | Ng et al. ...................... 365/49.1 |
| 6,934,796 B1 * | 8/2005 | Pereira et al. ................. 711/108 |
| 7,382,637 B1 * | 6/2008 | Rathnavelu et al. ....... 365/49.17 |

* cited by examiner

*Primary Examiner* — David Vincent
(74) *Attorney, Agent, or Firm* — Barnes & Thornburg LLP

(57) ABSTRACT

Disclosed is a method of recovering from overflow of a hardware dynamically reconfigurable NFA cell array, to find matches within a symbol stream to regular expression or similar rules without missing matches due to overflow. Upon overflow, active states are selected to spill from the cell array, saving state information and spill position. Scanning continues a limited distance, with additional overflow spills possible, to a selected end of segment position where all active end states are removed and recorded. A re-scan of the segment from the first overflow position begins with each previously spilled state re-injected at the same position it was spilled from. At the end of the segment, saved end states are re-injected and scanning continues. RE-scans may iterate if there was additional overflow. NFA states may be assigned color codes, with connected states receiving the same color, to aid in efficient overflow recovery.

21 Claims, 6 Drawing Sheets

NON-DETERMINISTIC FINITE AUTOMATON (NFA) OVERFLOW RECOVERY THAT EJECTS AN END OF SCAN SET OF ACTIVE STATES INTO A BUFFER

FIELD OF THE INVENTION

The field of the invention relates generally to ruleset matching. Embodiments of the invention may relate to ruleset matching overflow.

BACKGROUND

With the maturation of computer and networking technology, the volume and types of data transmitted on the various networks have grown considerably. For example, symbols in various formats may be used to represent data. These symbols may be in textual forms, such as ASCII, EBCDIC, 8-bit character sets or Unicode multi-byte characters, for example. Data may also be stored and transmitted in specialized binary formats representing executable code, sound, images, and video, for example. Along with the growth in the volume and types of data used in network communications, a need to process, understand, and transform the data has also increased. For example, the World Wide Web and the Internet comprise thousands of gateways, routers, switches, bridges and hubs that interconnect millions of computers. Information is exchanged using numerous high level protocols like SMTP, MIME, HTTP and FTP on top of low level protocols. Further, instructions in other languages may be included with these standards, such as Java and Visual Basic. There are numerous instances when information may be interpreted to make routing decisions. In an attempt to reduce the complexity associated with routing decisions, it is common for protocols to be organized in a matter resulting in protocol specific headers and unrestricted payloads. Subdivision of the packet information into packets and providing each packet with a header is also common at the lowest level, for example TCP/IP. This enables the routing information to be at a fixed location thus making it easy for routing hardware to find and interpret the information.

SUMMARY

An embodiment of the invention may therefore comprise a method of recovering from an overflow in an NFA in a dynamically configurable NFA cell array, comprising: scanning an input stream; recognizing an overflow condition in the NFA cell array; ejecting an overflow set of active states from the cell array into one of at least one state buffer, the set of active states comprising a portion of the active states in the NFA cell array; determining a segment length in the input stream from a current position to a first end of segment position; continuing scanning of the input symbols to the first end of segment position; ejecting an end of scan set of active states into one of the at least one state buffer, the end of scan set of active states comprising all remaining active states in the NFA cell array at the end of the step of continuing scanning; and rescanning the segment.

An embodiment of the invention may further comprise a system for matching symbols of an input stream in an NFA, comprising: a dynamically configurable NFA cell array; and at least one state buffer; wherein, during a scan of the input stream, the NFA cell array is enabled to: eject a portion of active states to one of the at least one state buffer after detection of an overflow condition; continue the scan for a predetermined segment of the input stream; eject the remaining active states in the NFA cell array at the end of the segment to one of the at least one state buffers; re-load the previously ejected states into the NFA cell array; re-scan the input stream segment; and re-load all active states from the at least one state buffer after the re-scan.

DETAILED DESCRIPTION OF THE EMBODIMENTS

Figure 1:
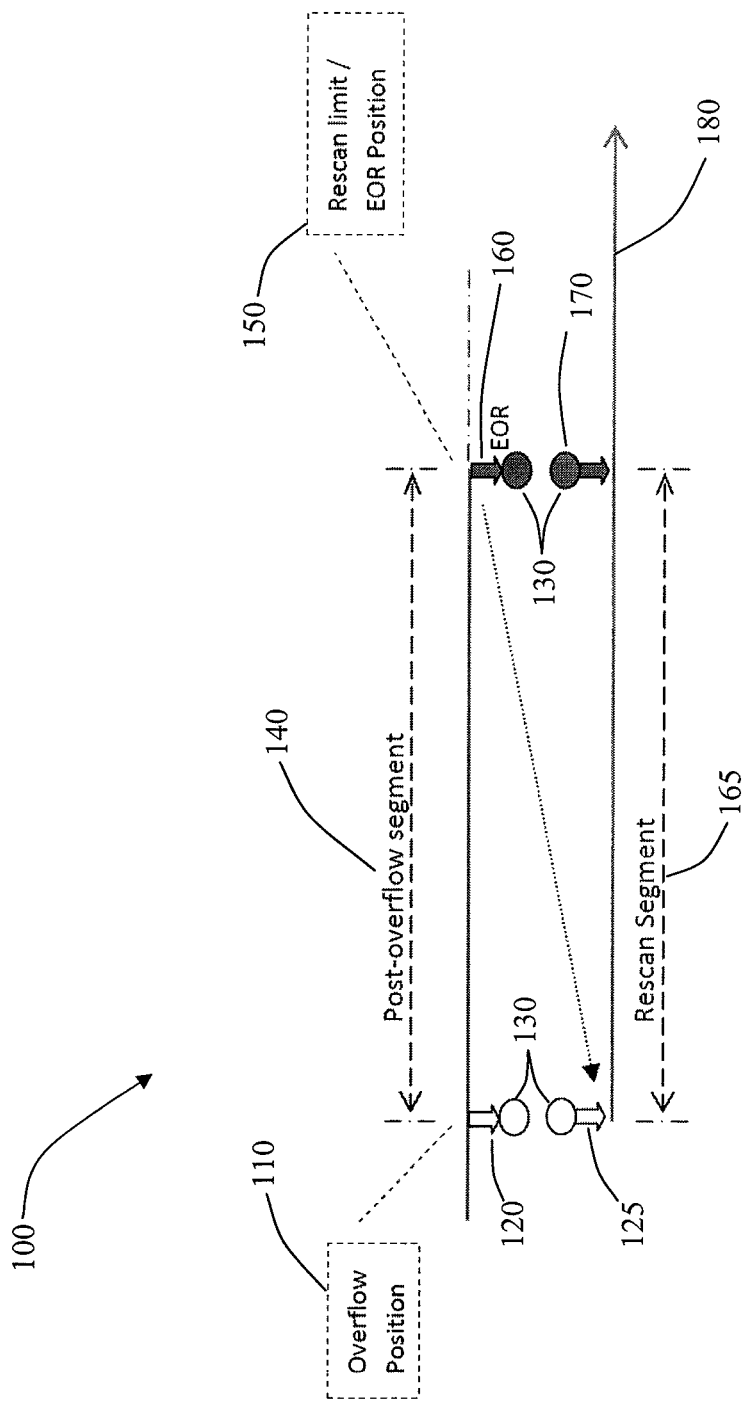
FIG. 1 is an overflow scenario flow diagram of an embodiment of the invention.

With the increasing nature of the transmission of information, there is an increasing need to be able to identify the contents and nature of the information as it travels across servers and networks. Once information arrives at a server, having gone through all of the routing, processing and filtering along the way, it is typically further processed. This further processing necessarily needs to be high speed in nature.

The first processing step that is typically required by protocols, filtering operations, and document type handlers is to organize sequences of symbols into meaningful, application specific classifications. Different applications use different terminology to describe this process. Text oriented applications typically call this type of processing lexical analysis. Other applications that handle non-text or mixed data types call the process pattern matching.

Performing lexical analysis or pattern matching is generally a computationally expensive step. This is because every symbol of information needs to be examined and dispositioned.

Regular expressions are well known in the prior art and are used for pattern matching and lexical analysis. Regular expressions provides a concise and flexible means for "matching" strings of text, such as particular characters, words, or patterns of characters. Abbreviations for "regular expression" include "regex" and "regexp" and these abbreviations may be used throughout this specification interchangeably with each other and with the term "regular expression". A regular expression is written in a formal language that can be interpreted by a regular expression processor, which can be a program that examines text or other characters in and identifies parts that match the provided rules of the regular expression. A regular expression in its simplest expression is a pattern. It is an expression that specifies a set of strings Examples of specifications that could be expressed in a regular expression are as follows:
  the sequence of characters "car" appearing consecutively in any context, such as in "car", "cartoon", or "bicarbonate"
  the sequence of characters "car" occurring in that order with other characters between them, such as in "Icelander" or "chandler"

the word "car" when it appears as an isolated word
the word "car when preceded by the word "blue" or "red"
the word "car" when not preceded by the word "motor"
a dollar sign immediately followed by one or more digits, and then optionally a period and exactly two more digits (for example, "$100" or "$245.98").

These sequences are simple and are intended only for purposes of example. Specifications of great complexity are conveyable by regular expressions.

Regular expressions are used by many text editors, utilities, and programming languages to search and manipulate text based on patterns. Some of these languages, including Perl, Ruby, AWK, and Tcl and may integrate regular expressions into the syntax of the core language itself. Other programming languages like .NET languages, Java, and Python provide regular expressions through standard libraries.

To match regular expressions or similar pattern matching rules, two main types of state machines may be constructed, nondeterministic and deterministic finite automata (NFAs and DFAs). NFAs for multiple rules are commonly executed separately, either in a sequential manner as in software, or in a parallel manner as in hardware.

Abstractly, an NFA is a directed graph of NFA states, in which each graph edge is labeled with a class of input symbols that it accepts, representing a transition from a source state to a destination state on a particular symbol class. Classically, on "start state" is understood to be "active" at the beginning of a stream, or sequence, of input symbols. As each symbol in the stream is consumed, an active state may transition to a destination state along a graph edge labeled with a class containing that symbol, so that the destination state becomes active after that symbol. An NFA may be constructed to match one or more regular expressions or similar rules, with states and transitions corresponding to the rules such that some state will be active if the input symbols so far consumed form the beginning of a possible match to some rule. Each rule corresponds to at least one special "accepting state," which becomes active when the rule has been completely matched by the input symbols consumed.

According to one method of executing NFAs, as each input symbol is consumed, all transitions from each active state which are labeled with CCLs containing (or "matching") the symbol are taken together—potentially activating multiple destination states at once. A hardware NFA engine may be constructed to execute NFAs using this method. In such an engine, multiple NFA cells exist as physical logic within a cell array, where each cell is configured to track one or more NFA states derived from the rules. The states tracked by a cell may be active or inactive and cells are able to signal to other cells and activate them. Such signals represent state transitions. The cell array is initialized with start states active and input symbols or information corresponding to those symbols are broadcast to the cells. Logic associated with each transition is configured to detect the proper symbol class and examine each input symbol to determine if it belongs to the transition class. Whenever a state is active and the next symbol matches a transition class, a signal is sent to the destination cell.

According to a method of U.S. Pat. No. 7,899,904 by Ruehle, incorporated herein in its entirety, NFA cells may be dynamically reconfigured on demand during a scan so that a cell array does not need to be large enough for the entire NFA but only large enough for the an expected size of active state subsets achieved during a scan. When a cell is dynamically configured, signal connections are also configured between the cell and its destination and source states in the cell array.

The active state subset achieved during a scan may become larger than expected and overflow the size of the cell array. One method to handle this type of overflow event is to consider the overflow a fatal error and terminate the hardware scan. Another method to handle this type of overflow event is to continue scanning after the overflow and discard selected active states that do not fit in the cell array. The discarded states may be reported to provide information on which rules may have missing matches. Reports may also be used to re-scan rules associated with the discarded states.

An embodiment of the invention comprises a method of recovering from an overflow of a hardware dynamically reconfigurable NFA cell array. Active states are spilled out (ejected) of the cell array at the time of an overflow. The ejected states are then re-inserted (re-injected) during a re-scan of a segment of the input stream so that all active states are enabled to execute for their natural lifetimes (as long as matching continues, i.e. failure or completion) within some scan or re-scan iteration. This leads to all rule matches in the symbol stream being found and reported.

A cell array begins a scan with zero or more start states being present and active. The array then steps forward through symbol position of the input stream with active states remaining active or deactivating and transitioning to activate next states. A varying subset of all possible NFA states is active at various symbol positions and matches are found and reported when accepting states are active. NFA states are loaded into the array when they must be activated or may soon be activated. Inactive states are evicted from the array as needed to make room for new states being loaded. An external source may also generate launches of NFA states. For example, another matching engine which matches the beginnings of suitable rules or hash tables may generate launches. The external launches will cause corresponding NFA states to be loaded into the cell array and activated at corresponding symbol positions. The activated states may then transition to next states in the NFA as usual. The cell array will have a finite number of cells available to be configured for NFA states. A cell array overflow occurs when the number of active states in the NFA exceeds the capacity of the cell array.

When an overflow occurs, one or more active states are spilled (ejected and unloaded are equivalent terms in this regard). The spilled states will be recorded in a state buffer. The information that is recorded in the state buffer will be at least the information necessary to re-load the state in the cell array at a necessary time. This may include a reference to the state, the spill position in the input stream, a spin count if appropriate and other internally tracked information. If an overflow occurs, at least enough of the active states will be spilled into the state buffer so that all of the remaining states of the correct active state subset fit in the cell array and have room to grow as states activate further destination states. After the spill of active states and recording of information in the state buffer, scanning of the input stream continues sequentially with the remaining active states.

A determination is made of a re-scan segment in the input stream. The re-scan segment will begin at the first spill position and end at a distance later in the input stream. The re-scan segment determination is made at the time of the spill or shortly thereafter. The length of the re-scan segment may vary according to different factors. The re-scan segment length can be affected by factors including scan speed, the remaining symbol stream length, the typical time lost per overflow events, the time to start or stop a scan and the typical length of an overflow condition or cluster of overflow conditions. If re-scan segment lengths are too short, performance loss may occur due to continuing overflow conditions after the segment is re-scanned. This will necessitate additional re-scans, which may be more costly than a longer re-scan. If re-scan lengths are too long, performance loss may occur because unnecessarily long re-scan segments are scanned twice. A fixed, configurable, or dynamically selected re-scan segment length may be used which is neither too long nor too short for the application, such as a fixed length of 256 symbols.

As noted, when a spill occurs, a portion of active states are ejected from the NFA and the NFA engine will continue the scan of the input stream with the remaining active states. During the continued scan of the input stream (to the end of the segment length), additional cell array overflows may occur. If this occurs, in order to maintain room in the NFA cell array, additional states must then be spilled into the state buffer. As this occurs, there will be various spill positions and the scanning will continue with the remaining active states in the array. When the end of a determined segment is reached, scanning will cease. All active states that are in the cell array at the end of the segment, known as end states, are removed and stored in a state buffer. The same or a different state buffer may be used. The mechanism of removing the active states at the end of a segment may be the same or different mechanism as removing active states during an overflow condition.

A new scan will initiate at the start of the re-scan segment. The input symbols will be examined again. As noted, the active states will have been removed from the cell array following the segment scan. At this point the cell array will be empty. Previously spilled states will be read from the state buffer and re-injected into the cell array. Each previously spilled state will be re-injected into the cell array at the same position within the re-scan where it was previously ejected. Thus, the first one or more previously spilled states will be re-injected at the beginning of the re-scan segment, and subsequent spilled states may be re-injected at later positions in the re-scan segment. If re-injecting spilled states at the beginning of the re-scan segment, or at a later position, causes another overflow, then some states will again be ejected from the cell array into the state buffer, to wait for a next re-scan. In an alternative embodiment, if it can be determined that not all previously spilled states will fit if re-injected, then a portion will be re-injected and the remainder will be re-saved for a next re-scan. The previously spilled states may have been written into consecutive positions in the state buffer as they were spilled and may be read back in the same order to facilitate re-injecting and re-activating them at successive positions. Re-injected states will scan normally in the re-scan. Finding and reporting matches to the rules will proceed as normal. The re-scan will proceed to the end of the segment. If no further overflow occurs then all saved end states are re-injected and re-activated—which also may cause an additional overflow, with some active states being ejected at the end of the segment. If no additional overflows occurred during the re-scan, the cell array will be re-established with the full correct active state subset and scanning will continue for the remainder of the input stream.

As noted, if an additional overflow occurs during the rescan of a segment, active states must again be spilled out into the state buffer. This will require a next re-scan to occur after the current re-scan completes, and a re-scan segment for the next re-scan must be defined. A first option to a re-scan overflow may be that the currently defined re-scan segment end point can be retained. The segment start point can possibly be moved forward to the position of the new first spill. Upon reaching the same segment end position, previously saved end states are not re-injected. All currently active states in the array are sent to the state buffer as additional end states. Another re-scan is initiated at the new beginning of the segment and the process iterates. A second option is that a new re-scan segment can be chosen with an end point further ahead than the previous end point. This new end point may be according to a similar or same policy of segment lengths, such as 256 symbol positions ahead of the first spill in the re-scan. In this case, upon reaching the previous re-scan segment end, all saved end states are re-injected into the cell array and scanning continues to the new end of segment. New end states are saved to the symbol buffer. A new re-scan is initiated at the new beginning of segment and the process iterates.

The first option noted above (re-using the previous end point) may be chosen when the first overflow occurs relatively early in the re-scan. This may be at least 128 symbols behind the end of segment. This option may avoid re-injecting the previous end states only to be re-exported at a new end of segment possibly just a short distance later, which is inefficient. The second option noted above (choosing a later end point) may be chosen when it is less than 128 symbols behind the end of segment. This option may avoid making the new re-scan segment too short. The overhead of starting a very short re-scan will be proportionately large and with increased likelihood that the overflow condition will continue or resume after the end point.

In some systems, an external source may launch states in the NFA. If an external source sends state launch signals into the cell array at specified symbol positions, the external launches may be applied the first time an input position is reached by the cell array. The external launch may not apply during a re-scan of the same symbol position. Once the external launch has activated a state a first time, it will be executed somewhere in the re-scan iterations. Each time the scanner backs up to initiate a re-scan, external launch signaling into the array should be stopped. Generated lunches may be buffered to apply later. Each time a re-scan passes the end of segment position and end states re re-injected, the scan will naturally be entering a portion of the input stream that has not been previously examined. External launch signals will resume.

When an active "parent" state in the cell array at one position matches an input symbol to transition to a destination "child" state, the child state becomes active at the next symbol position. A single parent state may have many child states, and it is possible that an active parent and all children it is transitioning to cannot fit in the cell array simultaneously. This requires special care, because if the parent state is ejected and re-injected into a re-scan, the same overflow situation may repeat indefinitely. To resolve this scenario, a parent-to-child transition may be supported via the overflow mechanism without the parent and child being present in the cell array simultaneously. The parent may attempt a transition to an absent child state while a current input symbol is consumed, but then flag a failed transition and stall the cell array at the next symbol position. If the child state can be loaded, the failed transition can retry, and successfully activate the child. If an overflow occurs and the parent state must be ejected, then its failed transition can trigger "ejecting" a reference to the absent child into the state buffer as well, with its spill position being the current position, where the child was supposed to activate due to the failed transition at the previous position. In the re-scan when the child is re-injected, the transition will be complete, and the active child state can stand on its own, even if the child and parent are separated by another overflow.

The re-scan process will find all proper matches. This is because the activities in each active state in the NFA are independent of the activities of other active states in a subset of active states. Each active state at some position in the input stream has an inherent potential to achieve a match. The potential of a state at a current symbol position to achieve a match at some later position requires only the ability for the state to evolve from the current position to the next position, and the ability to transition and activate a destination state at the next position, both of which can be done at the current position in any re-scan iteration, regardless of what other states are present or absent in the cell array at the current position in the same re-scan iteration.

When a scan encounters an overflow condition, the scan is bifurcated into two scans at the overflow position. Each branch will carry a share of the active states forward. A policy is used whereby the scans are divided substantially evenly. This may be an approximate 50%-50% or 60%-40% split. A more or less even division allows room in the NFA cell array for natural growth in the number of active states within each of the scans.

Spilled states may be tracked so as to not repetitively spill the same active states. It is possible for an active sate to be spilled out of a current scan but then re-loaded and re-activated later in the same scan. A parent state may transition to the spilled state or an external source may generate another launch of that states. Accordingly, tracking symbols elapsed since each state was most recently re-activated (even if already active) and selecting least recently re-activated states to spill out during overflow minimizes the risk of having a state re-activate during the scan.

"Color" coding may also be used to minimize state re-growth. Within an associated NFA compiler, or other tool, each state of the NFA may be assigned a "color" code from a list of possible colors. This may be from 0 to 15. It is understood that a "color" designation is not an actual color but is merely a coding mechanism used for purposes of explanation. Colors are distributed in a fairly balanced manner among the states of a NFA. Assignment of colors can be arbitrary. However, in order to minimize re-growth, any two states connected by a transition arc in the NFA should receive the same color. In other words, every connected sub-graph of the NFA should have a single color. Also, rules without substantially common beginnings may have separate start states or entrance states to be launched from an external source so that a large ruleset may have many disconnected sub-graphs. Color codes are included in the NFA instructions by the compiler and programmed into NFA cells configured with the states.

When an overflow occurs, the cell array will have active states of at least one color, and possibly of more than one color. If there is more than one color, a color will be chosen and all sates of the chosen color are spilled out. The cells occupied by each color may be counted in order to support relative balance in the multiple scans. Accordingly, the color with the largest occupancy may be spilled out. However, if the color with the largest occupancy is large to the extent that it occupies more than 40% of the array, a policy may be enforced that such a large state is maintained in the array. In such a case, then the next largest color is spilled. It is understood that just a single color may be spilled but that multiple colors may also be spilled in order to maintain balance.

It is also understood that the policy for spilling particular colors may be fundamentally arbitrary. However, a policy of counting the cells occupied by the colors of active states assists in achieving a balance of scans. As noted, the number of cells occupied by each color are counted. The counts are then sorted. The sorting may be from the largest count to the least count. Each color count is then examined. If a spill would result in more than a 50% aggregate spill, then no spill of the color being examined will result. The examination will proceed through the sorted list until the set of colors spilled gets closest to a 50% value. One policy may be to err on the side of spilling less. So, as stated, if a particular color would push the spill number over 50% then the spill will not occur. This is because in the NFA system, it takes time and resources to process the spills. It is understood that the 50% value can be individually tailored. A designer or user may prefer that anything over 40% not be spilled. In the event that a single color is over the arbitrary value determined for the particular cell array (50% for our example), then if the largest color is greater than that value, that color will be kept and every other color will be overflowed. In this manner, for a 50% value, the minimum of spills occurs while maintaining as much of a balance as possible.

Spilling states of particular colors has a favorable impact on possible state re-growth. By doing so, it is less likely that parent states of any spilled state will be present to re-activate the spilled state. It is understood that some re-growth may occur due to events such as external launching. State re-growth can be further reduced if external launches are not permitted to activate states of previously overflowed colors. The system will remember which colors have been spilled in an overflow event. External launches will be declined if the color matches a color which has been spilled out completely. The color of the target state of an external launch may be communicated with the external launch event, or may be decoded from instructions for the target state fetched pursuant to the external launch event, and then discarded if the decoded color matches an overflowed color. The external launches will be passed through to the state buffer as immediate spills with spill positions equal to their originally planned launch positions. Such pass-through is done in the background without direct performance impact on the NFA. Previously spilled states being re-injected can also be passed through to the state buffer if their color has already been completely spilled out on the current re-scan. If both external launches and spilled state re-injections of previously overflowed colors are passed through in this manner, state regrowth may be completely eliminated.

Memory of completely overflowed colors subject to pass-through is limited to the current re-scan. Once the end of segment is reached and another re-scan is initiated, all colors of re-injected states are accepted in the NFA until there is another overflow event. Passed-through state launches are treated the same as ordinary spilled states during the subsequent re-scan. They are re-injected at their recorded spill positions. These states thereafter execute normally in a different re-scan pass.

It may be possible that an overflow occurs when all active states have the same color. The entire color cannot be spilled out completely, because the same situation would recur in the re-scan, leading to an infinite loop. In this instance, a policy of color unaware behavior is used and states are selected one at a time to be spilled. This policy may be based on least recent activation or other method of differentiating the active states. Colors earlier spilled out completely still have external state launches passed through but the partially overflowed color do not pass through unless the color gets completely spilled out at a later overflow when more colors are active.

FIG. 1 is an overflow scenario flow diagram of an embodiment of the invention. The scenario 100 shows an initial overflow position 110. At the overflow position 110 a determination of which active states to expel is made. A state overflow spill 120 is made into a state buffer 130. Also, the length of the post-overflow segment 140 is determined, for example 256 symbols. The length of the segment 140 will determine the re-scan limit/EOR (end of rescan) position 150. The NFA cell array will continue scanning of the input symbols for the still configured active states until the re-scan limit 150 is reached. States may continue to be injected into the NFA cell array until the scan reaches the rescan limit 150. When the scanner reaches the re-scan limit 150, all of the active states in the cell array are dumped 160 into the state buffer 130. This state buffer 130 may be a same or different buffer from the buffer that the initial overflow was dumped into. If the same buffer is used, the states dumped at the re-scan limit 150 may be dumped into a separate pool in the state buffer 130. In this instance, the state buffer 130 may have two separate pools, which share the same memory with flexible boundaries, for overflow states 120 and EOR (still active) states 160. In the post-overflow segment 140 of this original scan, any external launch states (not shown) will activate states in the cell array normally, unless the overflow 120 was one or more entire colors and the external launch states have the same colors, in which case they will pass through and be dumped into the state buffer 130 without consuming them. A scan manager (not shown) will re-inject these external launch states like any other overflow state during the re-scan.

The scanner will back up to the overflow position 110. The overflow spill states 125 are re-injected from the state buffer 130 into the NFA cell array. The NFA will re-scan the input stream for a re-scan segment 165. In this instance, because there is shown only an initial overflow position 110 with no further overflows, the re-scan segment 165 is the same as the post-overflow segment 140. No external launches (not shown) will be processed during the re-scan 165, except external launches "passed through" (not shown) during the post-overflow segment 140 will be re-injected from the state buffer 130 at their originally planned activation positions. At the end of the re-scan segment 165 the scan manager will re-inject 170 the EOR states 160 from the state buffer 130. The NFA will continue to scan the input stream with a full set of active states in the NFA cell array.

Figure 2:
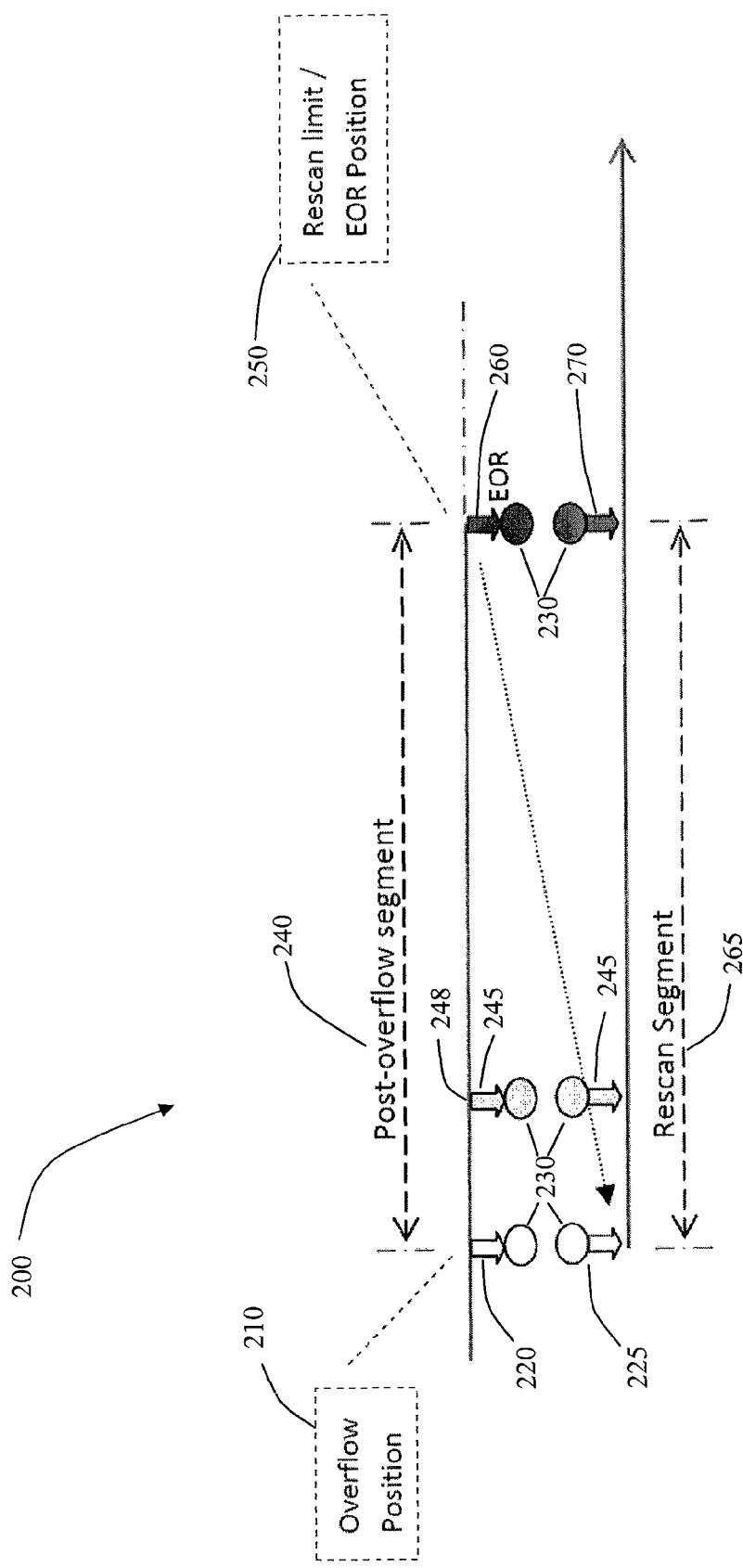
FIG. 2 is an overflow scenario flow diagram with a secondary overflow of an embodiment of the invention.

FIG. 2 is an overflow scenario flow diagram with a secondary overflow of an embodiment of the invention. The scenario 200 shows an initial overflow position 210. At the overflow position 210, a determination of which active states to expel is made. A state overflow spill 220 is made into a state buffer 230. Also, the length of a post-overflow segment 240 is determined, for example 256 symbols. The length of the segment 240 will determine the re-scan lime/EOR position 250. The NFA cell array will continue scanning of the input symbols for the still configured active states until the re-scan limit 250 is reached. A second overflow 248 occurs during the post-overflow segment 240. At the second overflow position 248, a determination of states to spill is made and a second state overflow spill 245 is made into the state buffer 230. States may continue to be spilled from the NFA cell array until the scan reaches the re-scan limit 250. When the scanner reaches the re-scan limit 250, all of the active states in the cell array are dumped 260 into the state buffer 230. This state buffer 230 may be a same or different buffer from the buffer that the initial overflow was dumped into. In the post overflow segment 240 of this original scan, any external launch states (not shown) will activate states in the cell array normally, unless they are passed through due to matching a fully overflowed color. A scan manager (not shown) will re-inject these passed through external launch states like any other overflow state during the re-scan.

The scan will back up to the overflow position 210. The overflow spill states 225 are re-injected from the state buffer 130 into the NFA cell array. The NFA will re-scan the input stream for a re-scan segment 265. The second overflow states 245 are re-injected from the state buffer 230 when the re-scan segment reaches the equivalent launch position 248 in the re-scan. Similarly, any passed-through external launches (not shown) are re-injected at their originally planned activation positions, but no external launches are applied directly because this re-scan 265 is not the first time its symbols are examined. At the end of the re-scan segment 265, the scan manager will re-inject 270 the EOR states 260 from the state buffer 230. The NFA will continue to scan the input stream 280 with a full set of active states in the NFA cell array.

Figure 3:
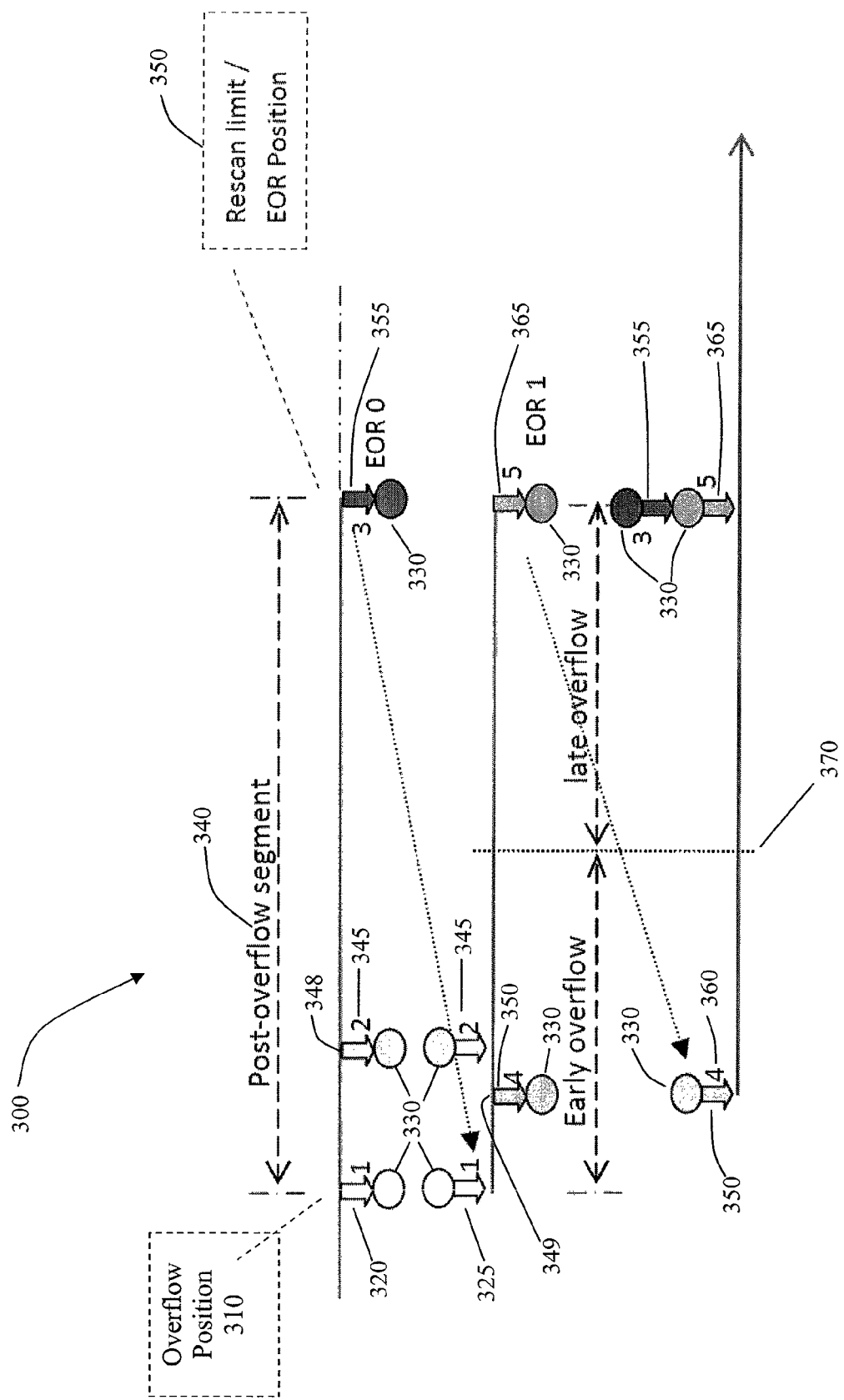
FIG. 3 is an overflow scenario flow diagram with early overflow in a re-scan of an embodiment of the invention.

FIG. 3 is an overflow scenario flow diagram with early overflow in a re-scan of an embodiment of the invention. In the re-scan segment there is also the possibility of overflows. The scenario 300 shows an initial overflow position 310. At the overflow position 310 a determination is made of which active states to expel. A state overflow spill 320 is made into a state buffer 330. The length of the post-overflow segment 340 is determined. The segment length 340 also determines a re-scan limit/EOR position 350. During the scan, a second spill 345 occurs due to a second overflow condition at a second overflow location 348. The second spill 345 is into the state buffer 330. Similar to FIGS. 1 and 2, at the end of the post-overflow segment 340, the remaining active states/EOR are ejected 355 into the state buffer 330. The scan backs up to the overflow position 310 in the input stream and the first overflow spill states 320 are re-injected into the NFA cell array. At the location of the second overflow spill 348, the second spill states 345 are re-injected into the NFA cell array from the state buffer 330. However, an early overflow occurs at a re-scan overflow position 349 and a re-scan spill 350 occurs. This early overflow position is considered early due its occurrence prior to a predetermined location 370 in the re-scan. Typically, the predetermined location will be the mid-point in the re-scan segment but it is understood that the location can occur wherever a policy dictates. The re-scan continues until it comes to the re-scan limit, which is the same EOR position 350 because the re-scan spill 350 was at an early position. The remaining re-scan active states will be ejected 365 into the state buffer 330. The end states previously ejected 355 at this position are not re-injected at this time, because the same EOR position 350 is being reused due to an early re-scan spill. The scanner will backup to the location 349 where the re-scan spill 350 occurred. The states from re-scan spill 360 are re-injected into the NFA cell array. A second re-scan will proceed until the re-scan limit location 350. At the re-scan limit location, the states ejected after the initial scan 355 and the states ejected at the end of the first re-scan 365 are re-inserted from the state buffer 330. Due to the fact that the early overflow spill 360 occurred during an early phase of the re-scan the overflow is determined from that point 349.

Figure 4:
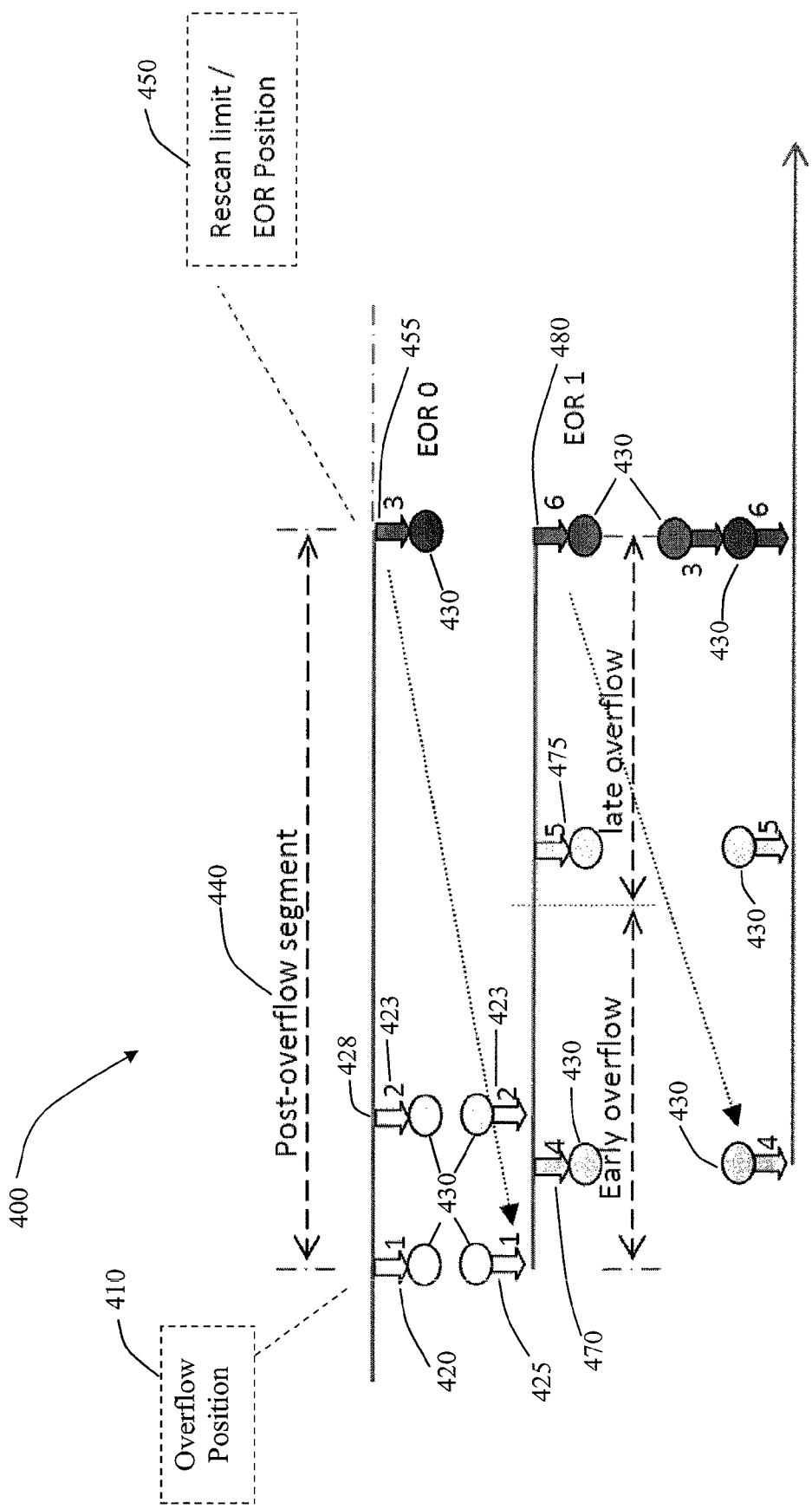
FIG. 4 is an overflow scenario flow diagram with early and late overflow in a re-scan of an embodiment of the invention.

FIG. 4 is an overflow scenario flow diagram with early and late overflow in a re-scan of an embodiment of the invention. The scenario 400 shows an initial overflow position 410. States are spilled 420 into the state buffer 430. A second spill of states 425 occurs into the state buffer 430. The scanner will continue until the end of the post-overflow segment to the re-scan limit/EOR position 450. At the re-scan limit 450, the remaining active states are ejected 455. The scanner backs up to the overflow position 410 and re-injects the states 420 from the first spill. The second spill states 425 are re-inserted at the second overflow position 428. An early overflow occurs and states are ejected 470 during the re-scan. A late overflow occurs and states are ejected 475 during the re-scan. At the end of the re-scan, the still active states are ejected 480 into the state buffer 430. The scanner will back up to the location of the first overflow spill 470. The states from the early overflow 470 are re-injected into the NFA cell array. When the scanner reaches the place where the late overflow spill 475 occurred, those states will be re-injected. When the scanner reaches the re-scan limit position 450 the states from the original scan 455 and the states ejected at the end of the first re-scan 480 are re-injected into the NFA cell array and the scan will continue. The boundary for the early overflow is based on the first overflow during the re-scan. No new limit locations are determined. All states are fully scanned.

Figure 5:
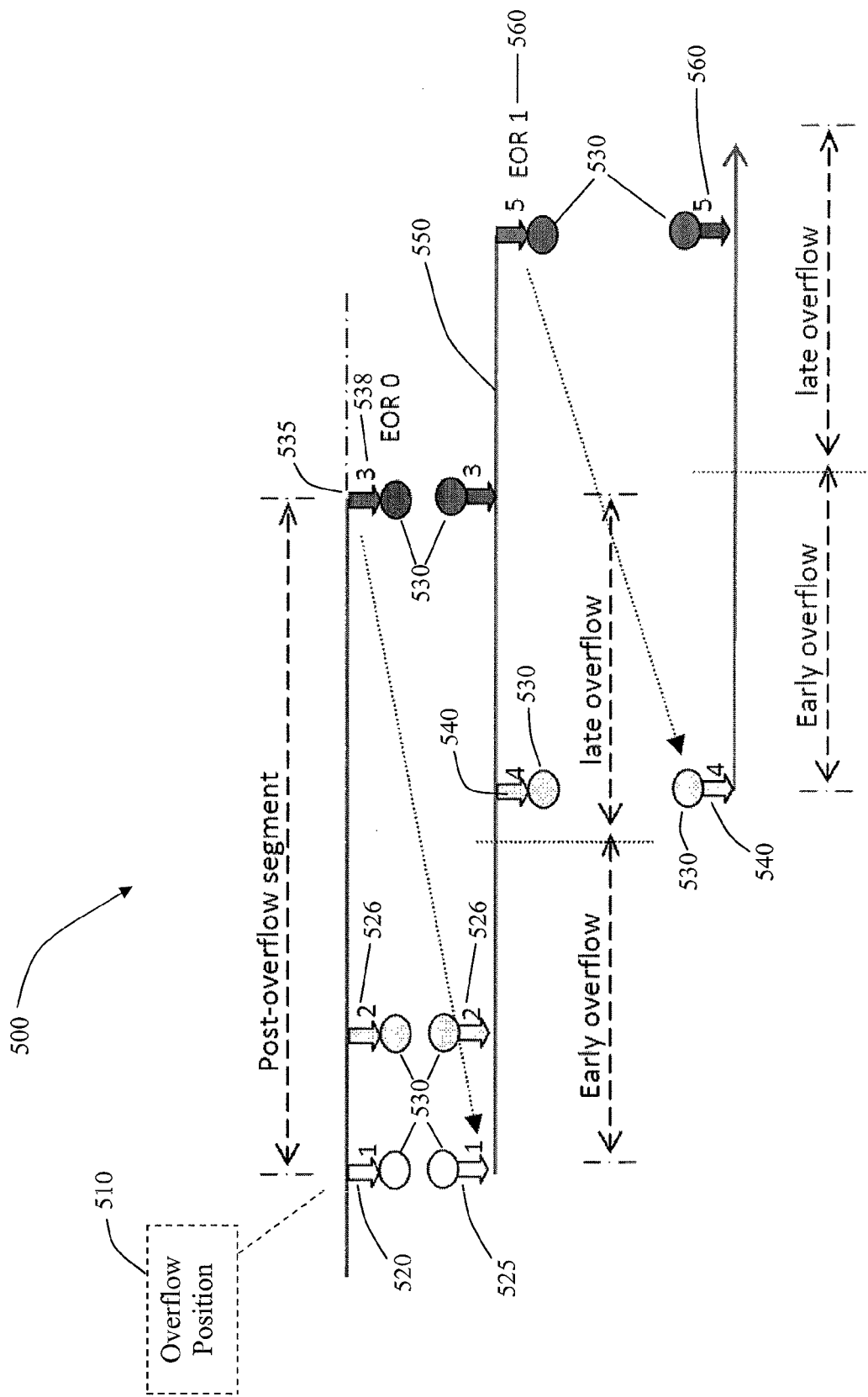
FIG. 5 is an overflow scenario flow diagram with late overflow in a re-scan of an embodiment of the invention.

FIG. 5 is an overflow scenario flow diagram with late overflow in a re-scan of an embodiment of the invention. The scenario 500 shows an initial overflow position 510. A spill of active states occurs 520 into a state buffer 530. A second spill of states 526 occurs into the state buffer 530. The scanner will continue until the end of the post-overflow segment to the rescan limit/EOR position 535. At the re-scan limit 535, the remaining active states are ejected 538. The scanner backs up to the overflow position 510 and re-injects the states 525 from the first spill. During the re-scan, the second spill of states 526 is re-injected at the same position they were ejected, and subsequently a late overflow occurs and states are spilled 540 into the state buffer 530. Due to the fact that that there was no early overflow during the rescan, a segment length 550 is determined for the late overflow occurrence, which extends beyond the first "EOR 0" position 535 to a new later "EOR 1" position. The segment length 550 may be, for example, 256 symbols. When the re-scan passes the first "EOR 0" position 535, ejected end states 538 are re-injected. This re-injection of saved end states while passing the previous EOR position on the way to a new EOR position is a feature distinguishing late overflow processing from early overflow processing. At the end of the late overflow segment 550, the active states are spilled 560 into the state buffer. The scan will back up to the position of the late overflow and re-inject the spilled states 540. The scanner will begin a re-scan from that location. During the re-scan, overflows could occur during the late or early portions of the segment 550. At the end of the late overflow segment 550, the states ejected at the end of the first re-scan 560 are re-injected into the NFA cell array. The scanner continues in normal fashion.

Utilizing an embodiment of the overflow recovery method of this invention may result in matches being reported out of the usual order. This is so because various matches may be found in multiple re-scans of the same input segment. Also, if color based state spilling fails so that individual states are spilled, the same match may be found multiple times on re-scans of the same segment. When color based spilling is successful, each input stream position will only be scanned by states of any given color one time. Duplicate matches will not be found due to overflow recovery. When color based spilling fails, various states of the partially spilled color scan the same input positions more than once and it is possible that an accepting state will become activated and report a match at the same position in multiple re-scans. In an embodiment, a sorter will sort matches into an order, such as according to start position or end position.

Figure 6:
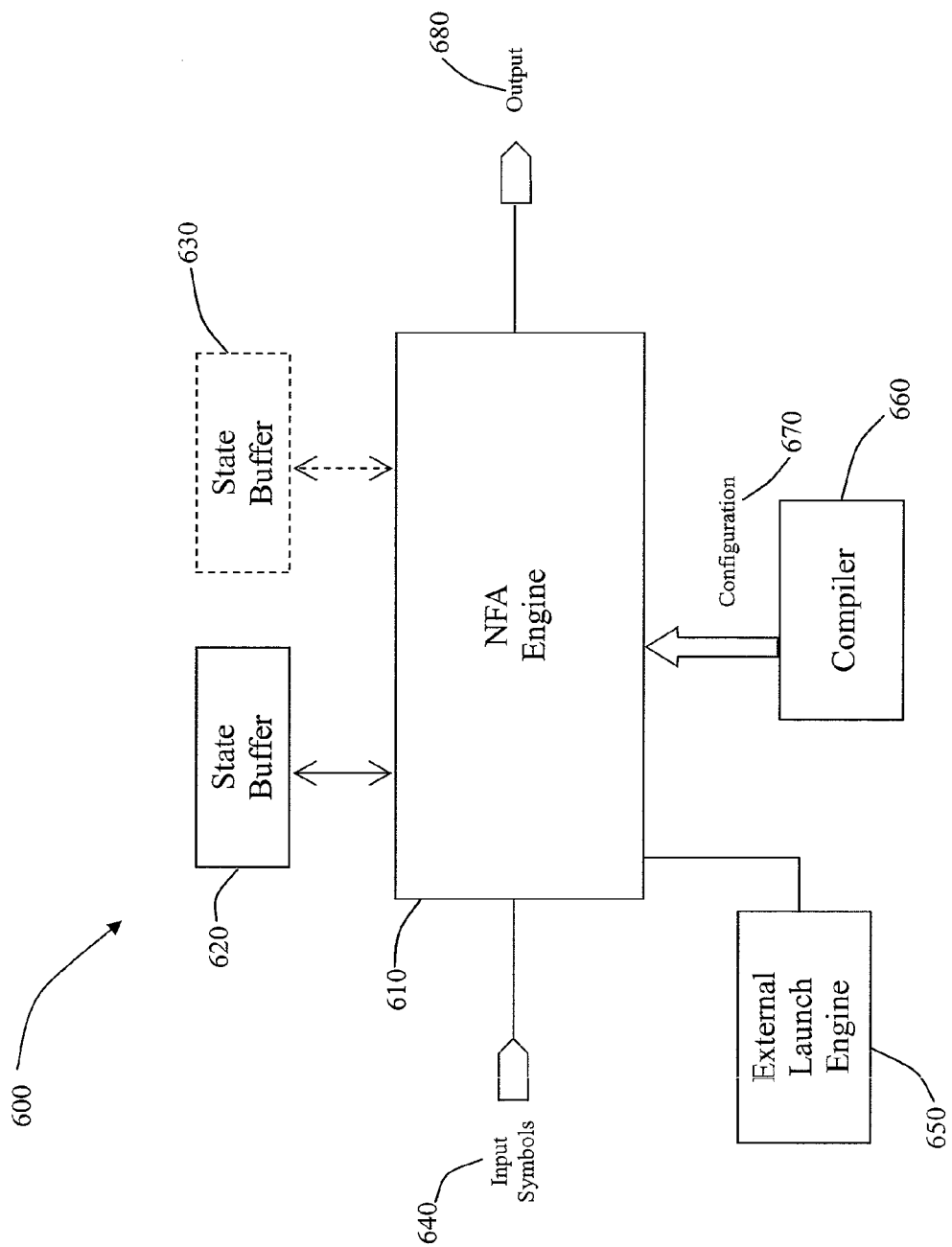
FIG. 6 is a block diagram of an embodiment of an overflow recovery system.

FIG. 6 is a block diagram of an embodiment of an overflow recovery system. The system 600 comprises an NFA engine 610 and a state buffer 620. The NFA engine 610 is a dynamically configurable NFA cell array which is enabled to eject and reload states into the cells. A second state buffer 630 is shown also connected to the NFA engine 610. Overflows which occur will send ejected states to a state buffer 620. When secondary ejections are made to a state buffer (such as at the end of an initial scan when still active states are ejected and previously ejected states are re-loaded), it is understood that a separate state buffer 630 may be utilized. It is also understood that the same state buffer 620 may be used. A different pool in the state buffer 620 may be used to maintain easy separation of the different state ejections. A stream of input symbols 640 are input into the NFA engine 610 for scanning. An external engine 650 may provide launches for input into the NFA engine 610. The external engine 650 may be a DFA engine or a hash tables, for example. It is also understood that a compiler 660 will compile a set of rules, such as a set of regular expressions, into an instruction set capable of configuring 670 the NFA engine 610. An output 680 will comprise tokens and other possible information.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A method of recovering from an overflow in an NFA in a dynamically configurable NFA cell array, comprising:
   scanning an input stream;
   recognizing an overflow condition in the NFA cell array;
   ejecting an overflow set of active states from the cell array into one of at least one state buffer, said set of active states comprising a portion of the active states in the NFA cell array;
   determining a segment length in the input stream from a current position to a first end of segment position;
   continuing scanning of the input symbols to the first end of segment position;
   ejecting an end of scan set of active states into one of the at least one state buffer, said end of scan set of active states comprising all remaining active states in the NFA cell array at the end of the step of continuing scanning; and
   rescanning the segment.

2. The method of claim 1, further comprising loading the end of scan set of active states into the NFA cell array when the step of rescanning reaches the first end of segment position.

3. The method of claim 2, farther comprising assigning one of a plurality of codes to each state in the NFA, wherein:
   states which share a connected NFA sub-graph are assigned the same one of said plurality of codes;
   the step of ejecting an overflow set of active states comprises selecting at least one of said plurality of codes; and
   said overflow set of active states comprises all active states in the cell array having the selected at least one code.

4. The method of claim 3, wherein the states with the selected codes occupy from one-third to two-thirds of the cell array.

5. The method of claim 3, further comprising:
   passing an externally launched state through to the state buffer if, during the step of continuing scanning, said externally launched state has a code which is the same as a selected code.

6. The method of claim 1, further comprising:
   if a secondary overflow condition occurs after the step of ejecting an overflow set of active states occurs, ejecting a secondary overflow set of active states into one of the at least one state buffer.

7. The method of claim 6, further comprising:
loading the secondary overflow set of active states into the NFA cell array when the step of rescanning reaches the position of the secondary overflow condition; and
loading the end of scan set of active states into the NFA cell array when the step of rescanning reaches the first end of segment position.

8. The method of claim 7, further comprising assigning one of a plurality of codes to each state in the NFA, wherein:
states which share a connected NFA sub-graph are assigned the same one of said plurality of codes;
the step of ejecting an overflow set of active states comprises selecting at least one of said plurality of codes;
the step of ejecting a secondary overflow set of active states comprises selecting at least one of said plurality of codes; and
said overflow set of active states and said secondary overflow set of active states comprise all active states in the cell array having the respective selected at least one code.

9. The method of claim 8, further comprising:
passing an externally launched state through to the state buffer if, during the step of continuing scanning, said externally launched state has a code which is the same as a selected code; and
passing an externally launched state through to the state buffer if, during the step of rescanning, said externally launched state has a code which is the same as a selected code.

10. The method of claim 1, further comprising:
if a second overflow condition occurs during the step of re-scanning the segment;
ejecting an overflow rescan set of active states into one of said at least one state buffer;
ejecting an end of rescan set of active states into one of the set of at least one state buffers at the end of the step of rescanning;
loading the overflow rescan set of states into the NFA cell array from the state buffer;
rescanning the segment a second time beginning from the position of the second overflow condition;
and loading the end of scan set of active states and the end of rescan set of active states from the at least one state buffer into the NFA cell array when the step of rescanning a second time reaches the first end of segment position.

11. The method of claim 10, further comprising assigning one of a plurality of codes to each state in the NFA, wherein:
states which share a connected NFA sub-graph are assigned the same one of said plurality of codes;
the step of ejecting an overflow set of active states comprises selecting at least one of said plurality of codes;
the step of ejecting a rescan set of active states comprises selecting at least one of said plurality of codes; and
said overflow set of active states and said rescan set of active states comprise all active states in the cell array having the respective selected at least one code.

12. The method of claim 11, further comprising:
passing an externally launched state through to the state buffer if, during the step of continuing scanning, said externally launched state has a code which is the same as a selected code; and
passing an externally launched state through to the state buffer if, during the step of rescanning, said externally launched state has a code which is the same as a selected code.

13. The method of claim 1, further comprising:
if an overflow condition occurs during the step of re-scanning the segment:
ejecting an overflow rescan set of active states into one of said at least one state buffer;
determining a second segment length, said second segment extending from the position of the ejection of the overflow rescan set of active states to a second end of segment position beyond the first end of segment position;
ejecting an end of rescan set of active states into one of said at least one state buffers at the second end of segment position;
loading the overflow rescan set of active states into the NFA cell array from the at least one state buffer;
rescanning the second segment;
loading the end of scan set of active states into the NFA cell array when the second rescan reaches the first end of segment position;
continuing rescanning the second segment; and
loading the end of rescan set of active states from the state buffer into the NFA cell array when the second rescan reaches the second end of segment position.

14. The method of claim 13, further comprising assigning one of a plurality of codes to each state in the NFA, wherein:
states which share a connected NFA sub-graph are assigned the same one of said plurality of codes;
the step of ejecting an overflow set of active states comprises selecting at least one of said plurality of codes;
the step of ejecting a rescan set of active states comprises selecting at least one of said plurality of codes; and
said overflow set of active states and said rescan set of active states comprise all active states in the cell array having the respective selected at least one code.

15. The method of claim 14, further comprising:
passing an externally launched state through to the state buffer if, during the step of continuing scanning, said externally launched state has a code which is the same as a selected code; and
passing an externally launched state through to the state buffer if, during the step of rescanning, said externally launched state has a code which is the same as a selected code.

16. A system for matching symbols of an input stream in an NFA, comprising:
a dynamically configurable NFA cell array; and
at least one state buffer;
wherein, during a scan of the input stream, the NFA cell array is enabled to:
eject a portion of active states to one of said at least one state buffer after detection of an overflow condition;
continue the scan for a predetermined segment of the input stream;
eject the remaining active states in the NFA cell array at the end of the segment to one of the at least one state buffers;
re-load the previously ejected states into the NFA cell array;
re-scan the input stream segment; and
re-load all active states from the at least one state buffer after the re-scan.

17. The system for matching symbols from an input stream of claim 16, further comprising a compiler, said compiler being enabled to code all states of the NFA, wherein states which share a connected NFA sub-graph are assigned the same code.

18. The system for matching symbols from an input stream of claim 17, wherein the portion of active states which the NFA cell array is enabled to eject will comprise all of the active states with one of said same coded states.

19. The system for matching symbols from an input stream of claim 18, further comprising an external launch engine, wherein said NFA cell array is further enabled to pass through launches from the external launch engine so that external launch states are stored in the state buffer.

20. The system for matching symbols from an input stream of claim 16, further comprising an external launch engine, wherein said NFA cell array is further enabled to pass through launches from the external launch engine so that external launch states are stored in the state buffer.

21. A method of matching symbols in an input stream with a set of instructions compiled from a ruleset, comprising:
   compiling the ruleset;
   scanning the input stream with a dynamically configurable NFA cell array;
   detecting an overflow condition in the NFA cell array at a position in the input stream;
   ejecting a portion of active states in the NFA cell array into an at least one state buffer;
   determining a segment length beginning from the position in the input stream that the overflow occurred to a pre-determined distance from said position;
   continuing scanning of the input stream until the end of the segment;
   ejecting any remaining active states into the at least one state buffer;
   loading the previously ejected states into the NFA cell array;
   re-scanning the segment;
   re-loading the any remaining active states from the state buffer.

* * * * *